(12) United States Patent
Nawate et al.

(10) Patent No.: US 12,424,369 B2
(45) Date of Patent: Sep. 23, 2025

(54) COMMON MODE NOISE FILTER

(71) Applicant: Panasonic Intellectual Property Management Co., Ltd., Osaka (JP)

(72) Inventors: Masakatsu Nawate, Osaka (JP); Atsushi Shinkai, Fukui (JP); Hideki Tanaka, Fukui (JP); Takuji Kawashima, Fukui (JP); Takeshi Ichihara, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1615 days.

(21) Appl. No.: 16/603,584

(22) PCT Filed: Jul. 24, 2018

(86) PCT No.: PCT/JP2018/027588
§ 371 (c)(1),
(2) Date: Oct. 7, 2019

(87) PCT Pub. No.: WO2019/031220
PCT Pub. Date: Feb. 14, 2019

(65) Prior Publication Data
US 2020/0303108 A1   Sep. 24, 2020

(30) Foreign Application Priority Data

Aug. 7, 2017 (JP) .................................. 2017-152087

(51) Int. Cl.
*H01F 27/28* (2006.01)
*H01F 17/00* (2006.01)
(Continued)

(52) U.S. Cl.
CPC ....... *H01F 17/0013* (2013.01); *H01F 27/323* (2013.01); *H01F 41/041* (2013.01); *H01F 41/122* (2013.01); *H01F 2017/0093* (2013.01)

(58) Field of Classification Search
CPC .. H01F 17/0013; H01F 27/323; H01F 41/041; H01F 41/122; H01F 2017/0093; H01F 27/2823; H01F 17/04; H03H 7/09
(Continued)

(56) References Cited

U.S. PATENT DOCUMENTS

2005/0184848 A1* 8/2005 Yoshida ................ H01F 41/046
336/223
2015/0042440 A1* 2/2015 Tsurumi .............. H01F 17/0006
336/221
(Continued)

FOREIGN PATENT DOCUMENTS

CN  1661737 A   8/2005
CN  103765533 A  4/2014
(Continued)

OTHER PUBLICATIONS

English Translation of Chinese Office Action dated Mar. 23, 2021 for the related Chinese Patent Application No. 201880031051.7.
(Continued)

*Primary Examiner* — Shawki S Ismail
*Assistant Examiner* — Kazi S Hossain
(74) *Attorney, Agent, or Firm* — Rimon P.C.

(57) ABSTRACT

A common mode noise filter includes an insulating layer, a first coil conductor disposed on a first surface of the insulating layer and extending slenderly, and a second coil conductor disposed on a second surface of the insulating layer and extending slenderly. The second coil conductor faces the first coil conductor across the insulating layer. A portion of the second coil conductor has a cross section
(Continued)

crossing a direction in which the portion of the second coil conductor extends slenderly. The cross section includes an apex portion facing the first coil conductor across the insulating layer and a base side portion opposite to the apex portion. A width of the apex portion is smaller than a width of the base-side portion. The common mode noise filter reduces attenuation of differential signals in high frequencies.

12 Claims, 6 Drawing Sheets

(51) Int. Cl.
*H01F 27/32* (2006.01)
*H01F 41/04* (2006.01)
*H01F 41/12* (2006.01)

(58) Field of Classification Search
USPC .......................................... 336/200, 232, 192
See application file for complete search history.

(56) References Cited

U.S. PATENT DOCUMENTS

| | | |
|---|---|---|
| 2016/0049234 A1 | 2/2016 | Kawashima et al. |
| 2016/0189852 A1* | 6/2016 | Jeon ..................... H01F 27/292 336/200 |
| 2019/0013133 A1* | 1/2019 | Sasaki ................. H01F 17/0013 |

FOREIGN PATENT DOCUMENTS

| | | |
|---|---|---|
| JP | 7-022241 | 1/1995 |
| JP | 2005-167029 | 6/2005 |
| JP | 2005-243807 | 9/2005 |
| JP | 2008-227045 A | 9/2008 |
| JP | 2012-089543 | 5/2012 |
| KR | 10-2016-080637 A | 7/2016 |
| WO | 2013/031680 | 3/2013 |
| WO | 2014/171140 A1 | 10/2014 |

OTHER PUBLICATIONS

International Search Report of PCT application No. PCT/JP2018/027588 dated Oct. 30, 2018.

* cited by examiner

COMMON MODE NOISE FILTER

CROSS-REFERENCE TO RELATED APPLICATIONS

This application is a U.S. national stage application of the PCT international application No. PCT/JP2018/027588 filed on Jul. 24, 2018, which claims the benefit of foreign priority of Japanese patent application No. 2017-152087 filed on Aug. 7, 2017, the contents all of which are incorporated herein by reference.

TECHNICAL FIELD

The present invention relates to common mode noise filters for use in a wide range of electronic equipment that includes digital equipment, audiovisual (AV) equipment, and information communication terminals.

BACKGROUND ART

FIG. 9 is a cross-sectional view of conventional common mode noise filter 500. Common mode noise filter 500 includes laminated body 1, two coil conductors 2 and 3 formed inside laminated body 1 and facing each other, and lead conductors 2a and 3a connected to coil conductors 2 and 3, respectively. Coil conductors 2 and 3 and lead conductors 2a and 3a are buried in non-magnetic body 4 of laminated body 1.

FIG. 10 is an enlarged cross-sectional view of common mode noise filter 500 for illustrating cross sections of coil conductors 2 and 3. The cross sections of coil conductors 2 and 3 have rectangular shapes. Common mode noise filter 500 may greatly attenuate differential signals in high frequencies.

A conventional common mode noise filter similar to common mode noise filter 500 is disclosed in, e.g. PTL 1.

CITATION LIST

Patent Literature

PTL 1: Japanese Patent Laid-Open Publication No. 2012-89543

SUMMARY

A common mode noise filter includes an insulating layer, a first coil conductor disposed on a first surface of the insulating layer and extending slenderly, and a second coil conductor disposed on a second surface of the insulating layer and extending slenderly. The second coil conductor faces the first coil conductor across the insulating layer. A portion of the second coil conductor has a cross section crossing a direction in which the portion of the second coil conductor extends slenderly. The cross section includes an apex portion facing the first coil conductor across the insulating layer and a base side portion opposite to the apex portion. A width of the apex portion is smaller than a width of the base-side portion.

The common mode noise filter reduces attenuation of differential signals in high frequencies.

DETAIL DESCRIPTION OF PREFERRED EMBODIMENTS

Figure 1:
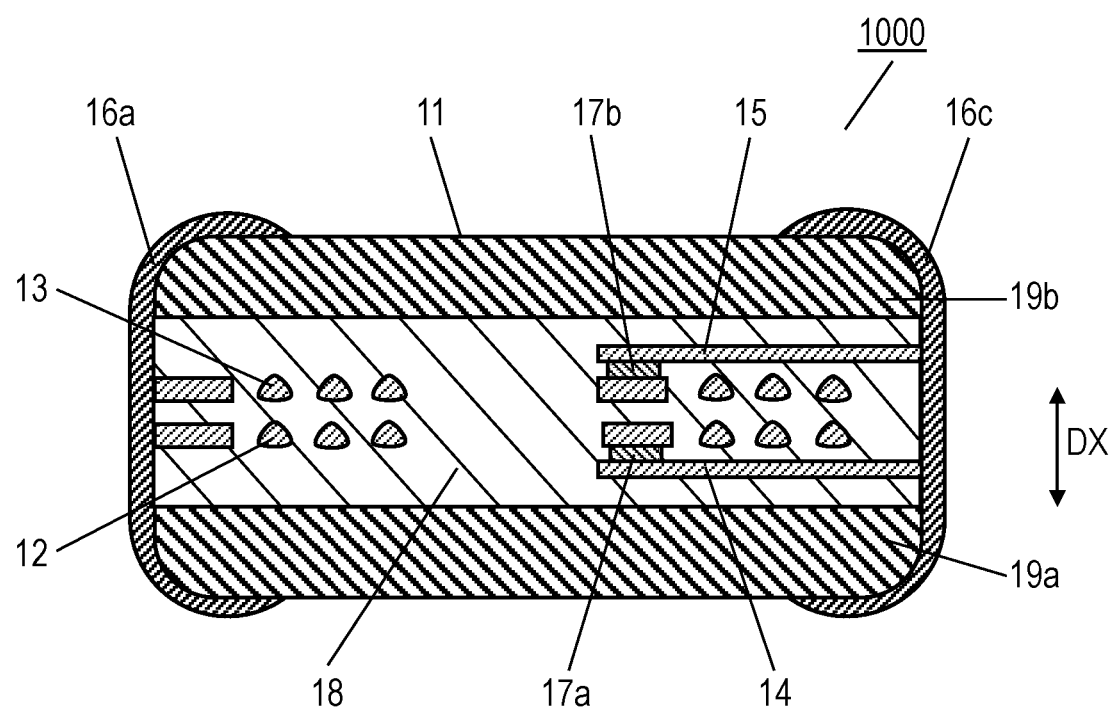
FIG. 1 is a cross-sectional view of a common mode noise filter according to an exemplary embodiment.
Figure 2:
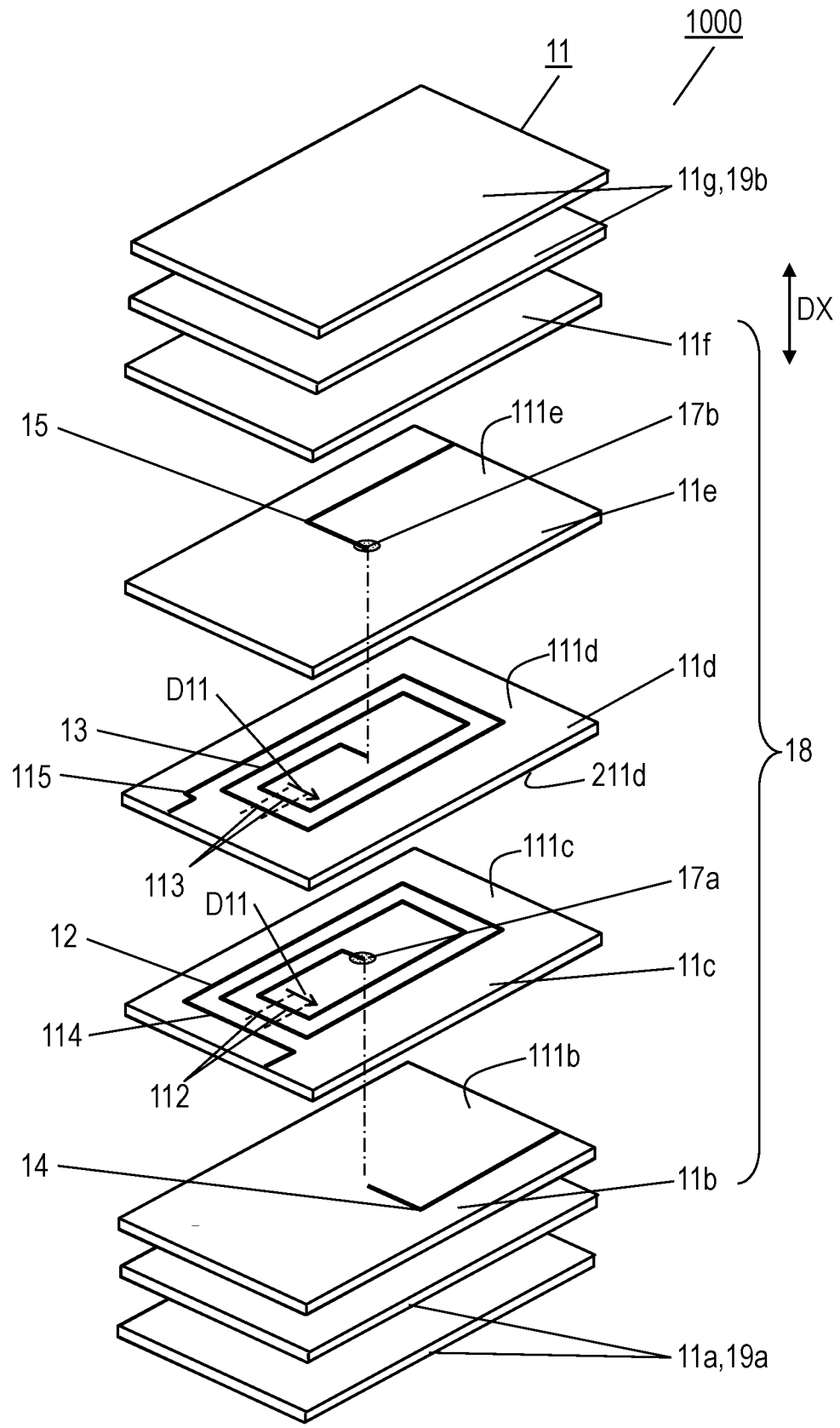
FIG. 2 is an exploded perspective view of the common mode noise filter according to the embodiment.
Figure 3:
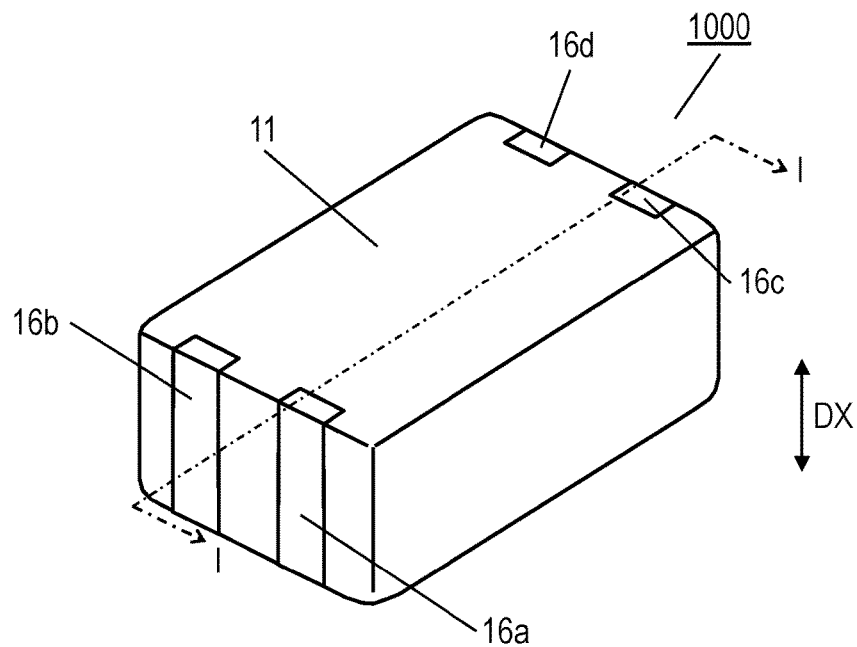
FIG. 3 is a perspective view of the common mode noise filter according to the embodiment.

FIG. 1 is a cross-sectional view of common mode noise filter 1000 according to an exemplary embodiment. FIG. 2 is an exploded perspective view of common mode noise filter 1000. FIG. 3 is a perspective view of common mode noise filter 1000. FIG. 1 is the cross-sectional view of common mode noise filter 1000 along line I-I shown in FIG. 3.

Common mode noise filter 1000 shown in FIG. 1 includes laminated body 11 and coil conductors 12 and 13 that are formed inside laminated body 11 and that face each other in lamination direction DX, i.e. an up-down direction.

Each of cross sections of coil conductors 12 and 13 perpendicular to directions in which currents flow has an apex portion and a base side portion. The apex portion of coil conductor 12 faces the base side portion of coil conductor 13.

As shown in FIG. 2, laminated body 11 includes insulating layers 11a to 11g, coil conductor 12 formed on upper surface 111c of insulating layer 11c, lead conductor 114 formed on upper surface 111c of insulating layer 11c, coil conductor 13 formed on upper surface 111d of insulating layer 11d, lead conductor 115 formed on upper surface 111d of insulating layer 11d, lead conductor 14 formed on upper surface 111b of insulating layer lib, and lead conductor 15 formed on upper surface 111e of insulating layer 11e. Lead conductor 14 is connected to coil conductor 12. Lead conductor 15 is connected to coil conductor 13. Coil conductor 12 and lead conductor 114 are connected to each other, and are made of a single conductor in accordance with the embodiment. Coil conductor 13 and lead conductor 115 are connected to each other, and made of a single conductor in accordance with the embodiment. Insulating layers 11a to 11g are laminated in lamination direction DX. This configuration causes coil conductor 12 to be disposed on lower surface 211d of insulating layer 11d.

As shown in FIG. 3, external electrodes 16a to 16d are provided on both ends of laminated body 11. Lead conductors 114, 115, 14, and 15 are connected to external electrodes 16a, 16b, 16c, and 16d, respectively. Coil conductor 12 is coupled to external electrode 16a via lead conductor 114. Coil conductor 13 is coupled to external electrode 16b via lead conductor 115. Currents flow from external electrodes 16a and 16c through lead conductors 114, coil conductor 12, and lead conductor 14. Currents flow from external electrodes 16b and 16d through lead conductor 115, coil conductor 13, and lead conductor 15.

Coil conductor 12 is coupled to lead conductor 14 via via-electrode 17a that passes through insulating layer 11c so as to constitute one coil. Coil conductor 13 is coupled to lead conductor 15 via via-electrode 17b that passes through insulating layer 11e so as to constitute another coil.

Lead conductors 14 and 15 linearly extend in accordance with the embodiment; however, the conductors may extend spirally. Both lead conductors 14 and 15 may be formed on one insulating layer among insulating layers 11a to 11f, and the locations of lead conductors 14 and 15 shown in FIG. 1 may be reversed to each other.

Coil conductor 12 and lead conductor 14 may be located between coil conductor 13 and lead conductor 15.

Insulating layers 11a to 11g are laminated in this order from below. Insulating layers 11b to 11f are made of non-magnetic material, such as glass ceramic, that contains glass, and have sheet shapes. Insulating layers 11a and 11g are made of magnetic material, such as Cu—Ni—Zn ferrite, and have sheet shapes.

Coil conductors 12 and 13 are disposed inside non-magnetic part 18 constituted by insulating layers 11b to 11f. Insulating layer 11a made of the magnetic material constitutes magnetic part 19a that is disposed below non-magnetic part 18. Insulating layer 11g constitutes magnetic part 19b that is disposed above non-magnetic part 18.

The number of the insulating layers, i.e. insulating layers 11a to 11g is not limited to the number shown in FIG. 2.

Coil conductors 12 and 13 has spiral shapes, and are formed by plating or printing conductive material, such as silver. Coil conductor 12 faces coil conductor 13 across insulating layer 11d. In accordance with the embodiment, coil conductor 12 entirely faces coil conductor 13 across insulating layer 11d. That is, coil conductors 12 and 13 except both ends of the conductors are disposed substantially at the same position and wound in the same direction when viewed from above, i.e. when viewed in lamination direction DX. This configuration the coil conductors to be magnetically coupled to each other.

Coil conductors 12 and 13 may not necessarily have the spiral shapes, and may have other shapes, such as helical shapes.

Figure 4:
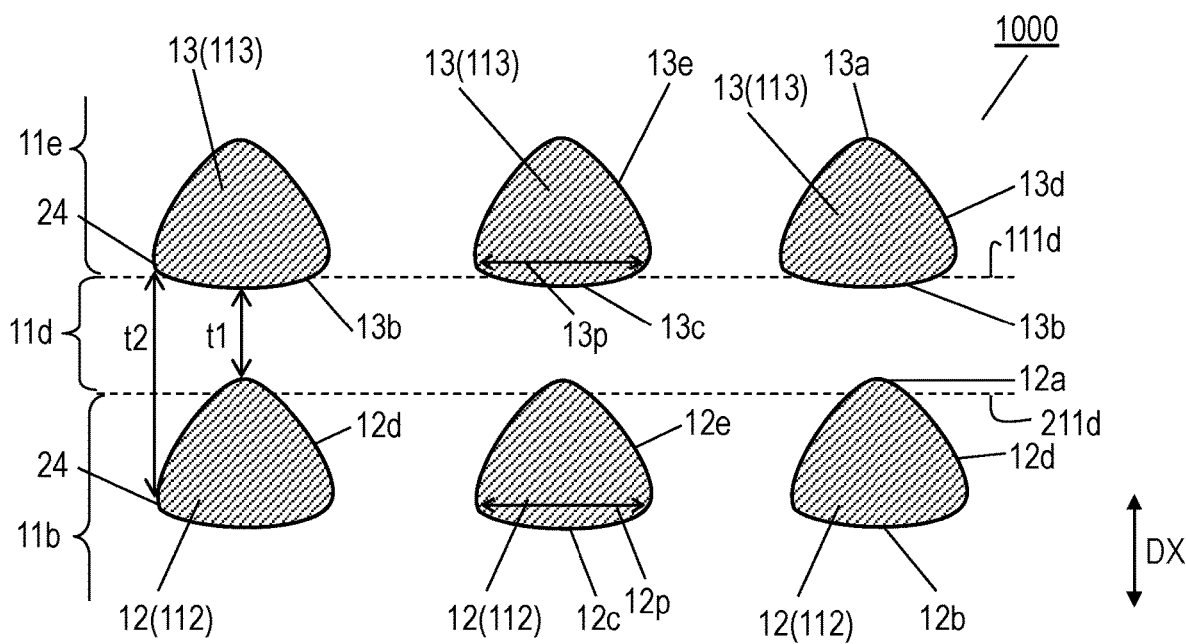
FIG. 4 is an enlarged cross-sectional view of a main part of the common mode noise filter according to the embodiment.

FIG. 4 is an enlarged cross-sectional view of common mode noise filter 1000 shown in FIG. 1 for illustrating cross sections of portions 112 and 113 of coil conductors 12 and 13 shown in FIG. 2. The cross sections, shown in FIG. 4, of portions 112 and 113 of coil conductors 12 and 13 are perpendicular to, i.e. cross direction D 11 in which portions 112 and 113 extend slenderly. That is, the cross sections, shown in FIG. 4, of coil conductors 12 and 13 are perpendicular to, i.e. cross lamination direction DX in which coil conductors 12 and 13 are laminated. Each of the cross sections, as a whole, substantially has a triangular shape having an apex portion and a base side portion opposite to the apex portion. Specifically, the cross section of portion 112 of coil conductor 12 has apex portion 12a and base side portion 12b opposite to apex portion 12a. The cross section of portion 113 of coil conductor 13 has apex portion 13a and base side portion 13b opposite to apex portion 13a. Apex portion 12a of coil conductor 12 faces base side portion 13b of coil conductor 13 across insulating layer 11d in lamination direction DX.

Base side portions 12b and 13b of coil conductors 12 and 13 include protrusion portions 12c and 13c protruding arcuately, respectively. The cross section, shown in FIG. 4, of portion 112 of coil conductor 12 further has leg side portions 12d connected to both apex portion 12a and base side portion 12b. The cross section, shown in FIG. 4, of portion 113 of coil conductor 13 further has leg side portions 13d connected to both apex portion 13a and base side portion 13b. Leg side portions 12d and 13d of coil conductors 12 and 13 have protrusion portions 12e and 13e protruding arcuately. Apex portions 12a and 13a of coil conductors 12 and 13 have arcuate shapes.

The cross sections of portions 112 and 113 of coil conductors 12 and 13 thus substantially have triangular shapes as a whole. Three apex portions including apex portion 12a (13a) of each triangular shape have arcuate shapes. The triangular shape has three sides, i.e. leg side portions 12d (13d) and base side portion 12b (13b) which protrude arcuately.

In the cross section of coil conductor 12 shown in FIG. 4, portion 12p which has the largest width when viewed from above deviates from the center of coil conductor 12 in lamination direction DX toward base side portion 12b. Similarly, in the cross section of coil conductor 13 shown in FIG. 4, portion 13p which has the largest width when viewed from above deviates from the center of coil conductor 13 in lamination direction DX toward base side portion 13b.

Each of base side portions 12b and 13b is a side positioned on the lower side of the corresponding cross section in lamination direction DX. Each of apex portions 12a and 13a is a point that is positioned on the upper side of the corresponding cross section in lamination direction DX. Each of leg side portions 12d corresponds to a line that connects between apex portion 12a and corresponding one of both ends of base side portion 12b. Each of leg side portions 13d corresponds to a line that connects between apex portion 13a and corresponding one of both ends of base side portion 13b.

In coil conductors 12 and 13, portions 112 and 113 having cross sections having triangular shapes as a whole may be respective effective portions of the respective coil conductors excluding lead conductors 14, 15, 114, and 115. The effective portions of coil conductors 12 and 13 faces each other across insulating layer 11d in lamination direction DX. That is, portion 112 of coil conductor 12 may be any portion of coil conductor 12, and portion 113 of coil conductor 13 may be any portion of coil conductor 13. As shown in FIG. 4, heights of the cross sections of coil conductors 12 and 13 in lamination direction DX is larger than widths of the cross sections in a direction perpendicular to lamination direction DX. However, the widths may be larger than the heights.

Portions 112 and 113 of coil conductors 12 and 13 having the cross sections with the triangular shapes when viewed as a whole and having apex portion 12a of coil conductor 12 and base side portion 13b of coil conductor 13 facing each other may be not the entire of the effective portions of coil conductors 12 and 13 but respective parts of the effective portions.

Portions 112 and 113 in which apex portion 12a of coil conductor 12 faces base side portion 13b of coil conductor 13 may be, e.g. respective halves of the effective portions.

Figure 5:
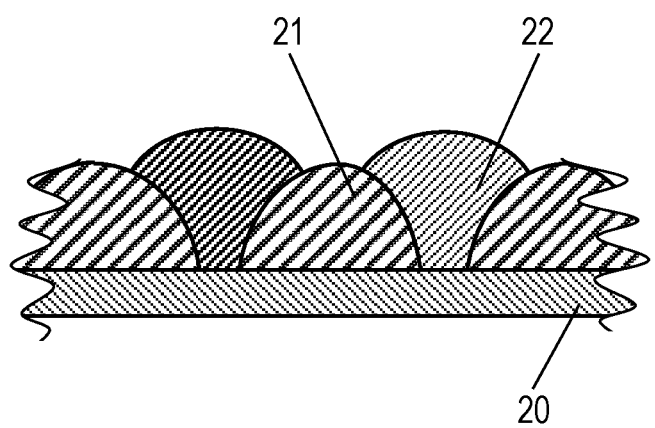
FIG. 5 is a cross-sectional view of the common mode noise filter according to the embodiment for illustrating a method of manufacturing the common mode noise filter.
Figure 6:
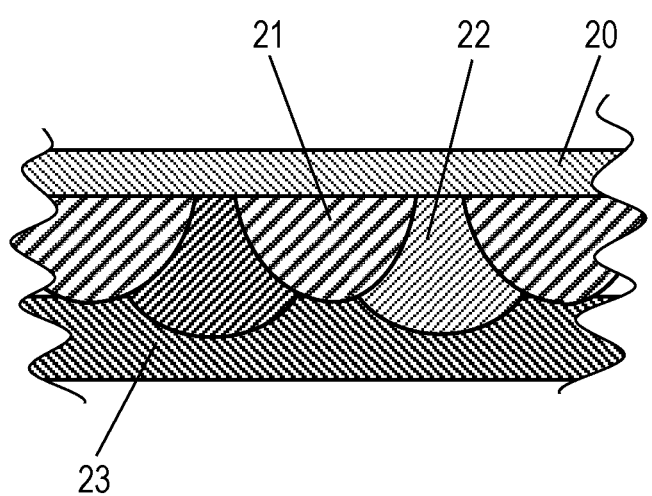
FIG. 6 is a cross-sectional view of the common mode noise filter according to the embodiment for illustrating a method of manufacturing the common mode noise filter.

A method of manufacturing common mode noise filter 1000 in accordance with the embodiment will be described below. FIGS. 5 and 6 are cross-sectional views of common mode noise filter 1000 for illustrating the method of manufacturing the filter.

First, laminated body 11 shown in FIG. 1 including magnetic parts 19a and 19b and non-magnetic part 18 which contains glass.

In this step, coil conductors 12 and 13 and lead conductors 14, 15, 114, and 115 made of silver and facing each other in lamination direction DX are formed inside non-magnetic part 18.

Coil conductors 12 and 13 are formed by the following method. First, as shown in FIG. 5, resist 21 made of resin is formed on base plate 20 along the shape of coil conductor 12 (13). Then, base plate 20 is plated with silver to form plated layer 22. Plated layer 22 is a part constituting coil conductor 12 (13).

After that, as shown in FIG. 6, both plated layer 22 and resist 21 which are formed on base plate 20 are transferred to transfer body 23 as they are. Transfer body 23 constitutes each of insulating layers 11c (11d). Then, both base plate 20 and resist 21 are removed, thereby forming only plated layer 22 on transfer body 23, i.e. insulating layer 11c (11d). Insulating layers 11a to 11g including insulating layers 11c and 11d on which plated layers 22 have been transferred are laminated to form laminated body 11, thereby forming coil conductors 12 and 13 inside non-magnetic part 18.

Then, laminated body 11 is fired at a temperature of, e.g. about 940° C. The temperature is higher than the glass-transition temperature (e.g. about 800° C.).

Finally, external electrodes 16a to 16d are formed on the both ends of laminated body 11.

In this method, the firing is executed at a temperature higher than the glass-transition temperature which increases the liquidity of glass, thereby easily changing the shapes of coil conductors 12 and 13 inside non-magnetic part 18. In addition, the firing causes coil conductors 12 and 13 made of silver to change the shapes thereof to reduce the surface areas thereof and allowing the cross sections of coil conductors 12 and 13 to have triangular shapes when viewed as a whole.

In this case, as shown in FIG. 5, plated layer 22 is slightly higher than resist 21. In addition, a portion of plated layer 22 which contacting base plate 20 and which constitutes portion 12a (13a) has a small area. Moreover, adjusting the firing temperature and plating conditions provides coil conductors 12 and 13 with the cross sections having the triangular shapes as a whole.

This method does not require the previous preparation for causing coil conductors 12 and 13 to have the cross sections with triangular shapes as a whole. Thus, the lamination and firing provides the cross sections with the triangular shapes.

The above method of forming coil conductors 12 and 13 is just an example; therefore, another method may be employed for forming them.

The shapes of coil conductors 12 and 13 may not necessarily be the triangular shapes shown in FIG. 4 as a whole. The same effect is obtained in the case that the cross section of coil conductor 12 (13) includes apex portion 12a (13a) and base side portion 12b (13b) having a larger width than apex portion 12a (13a) when viewed from above, i.e. in a direction parallel to upper surface 111c and lower surface 211c of insulating layer 11c, and the width decreases monotonously as a whole as being distanced away from base side portion 12b (13b) toward apex portion 12a (13a) while apex portion 12a (13a) has an arcuate shape.

Figure 7:
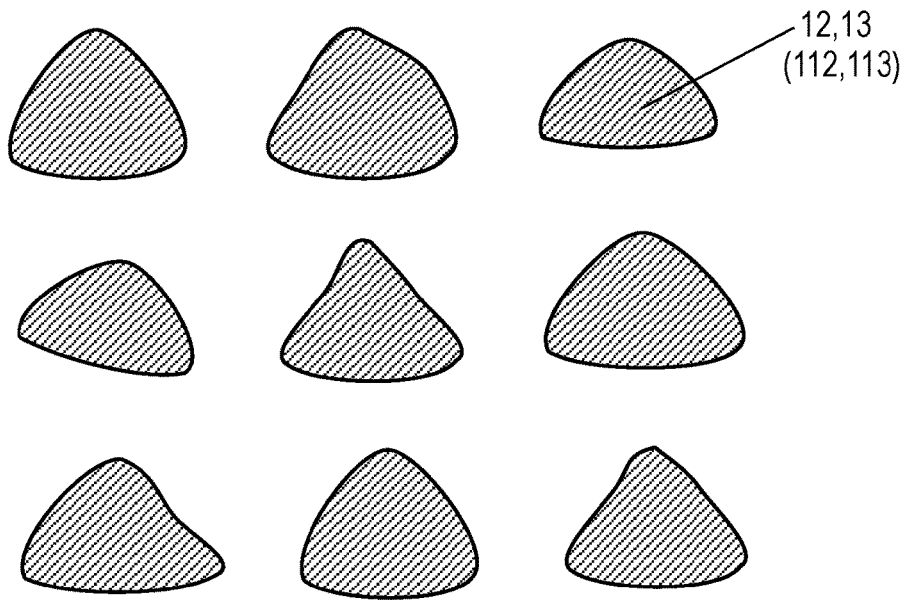
FIG. 7 is a cross-sectional view of a coil conductor of the common mode noise filter according to the embodiment.

FIG. 7 is a cross-sectional view of coil conductors 12 and 13 for illustrating cross sections of coil conductors 12 and 13 having other shapes. As shown in FIG. 7, parts of the cross sections of the coil conductors may protrude outward, or may slant as a whole. Variations in the firing temperature and/or plating conditions may result in these other shapes.

In common mode noise filter 1000 according to the embodiment, leg side portion 12d of each of coil conductor 12 faces base side portion 13b of corresponding coil conductor 13 and the distance between leg side portion 12d and base side portion 13b is long, accordingly decreasing a capacitance between coil conductors 12 and 13. Such a decreased capacitance between coil conductors 12 and 13 increases in a cut-off frequency at which differential signals drop by 3 dB, thus reducing attenuation of differential signals at high frequencies.

Figure 9:
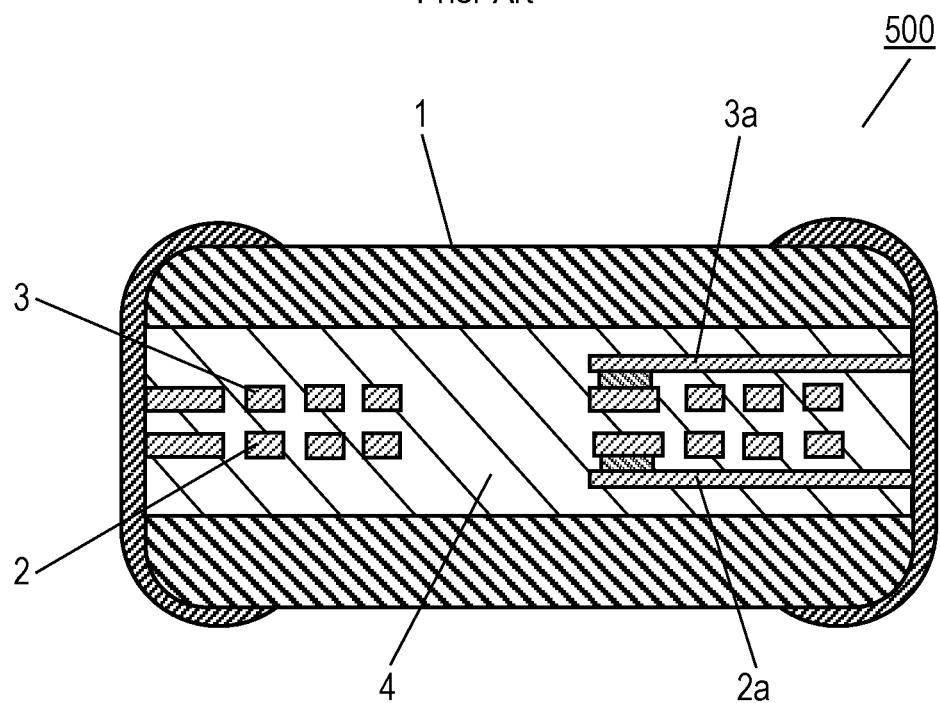
FIG. 9 is a cross-sectional view of a conventional common mode noise filter.
Figure 10:
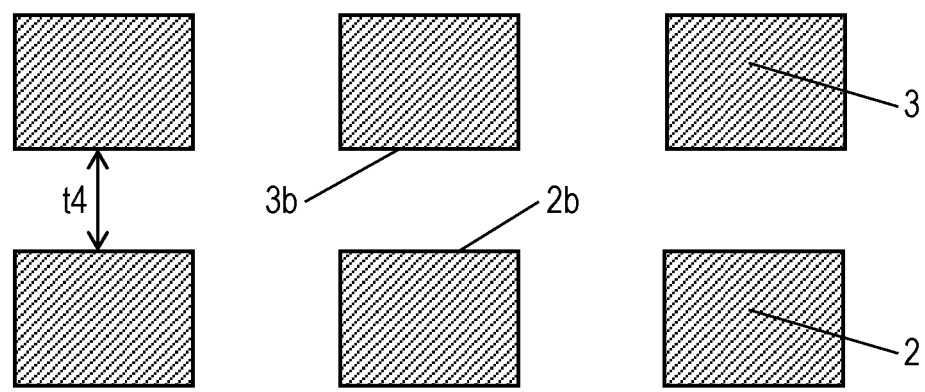
FIG. 10 is an enlarged cross-sectional view of the common mode noise filter shown in FIG. 9.

In conventional common mode noise filter 500 shown in FIGS. 9 and 10, in case that the filter has a low profile, the distance between coil conductors 2 and 3 facing each other decreases, accordingly increasing a capacitance between coil conductors 2 and 3. This may cause a large drop in differential signals in high frequencies.

In conventional common mode noise filter 500 shown in FIG. 10, coil conductors 2 and 3 have rectangular cross sections. Distance t4 between coil conductors 2 and 3 is constant over portions 2b and 3b facing each other, preventing the capacitance between coil conductors 2 and 3 from decreasing.

In contrast, in common mode noise filter 1000 according to the embodiment, even if distance t1 between apex portion 12a of coil conductor 12 and base side portion 13b of coil conductor 13 in lamination direction DX in which coil conductors 12 and 13 and the insulating layers are laminated, as shown in FIG. 4, is equivalent to the distance between the rectangular cross sections of the coils having being rectangular, a distance between leg side portion 12d of coil conductor 12 and base side portion 13b of coil conductor 13 in lamination direction DX increases at a position farther away from apex portion 12a. Accordingly, at such a farther position, the distance between coil conductor 12 and coil conductor 13 is longer.

The above configuration reduces the capacitance at the positions where leg side portion 12d of coil conductor 12 face base side portion 13b of coil conductor 13. Moreover, distance t2 between leg side portion 12d of coil conductor 12 and base side portion 13b of coil conductor 13 is longest at ends 24 of coil conductors 12 and 13 when viewed in lamination direction DX. In cases where the common mode noise filter has a low profile to have a thickness of insulating layer 11d, i.e. a distance between coil conductors 12 and 13 ranging, e.g. from 1 μm to 10 μm, and yet where coil conductors 12 and 13 have rectangular cross sections as shown in FIG. 10, such a distance between coil conductors 12 and 13 is so short that the capacitance between coil conductors 12 and 13 is large. For this reason, a cut-off frequency may become low.

In common mode noise filter 1000 according to the embodiment, the cross sections of coil conductors 12 and 13 have the triangular shapes as a whole allow the distance between coil conductors 12 and 13 to be long. This configuration decreases the capacitance between coil conductors 12 and 13 even in cases where the triangular cross sections have the same area as the rectangular cross sections.

Moreover, such a decrease in the capacitance between coil conductors 12 and 13 causes a peak of common mode impedance of common mode noise filter 1000 to shift to higher frequency, facilitating to remove common mode noises in frequencies of gigahertz.

The decrease in the capacitance between coil conductors 12 and 13 increases the characteristic impedance of common mode noise filter 1000 up to a predetermined characteristic impedance that complies with various communications standards. This configuration prevents degradation, such as decay, of differential signals.

In common mode noise filter 1000, base side portions 12b and 13b of coil conductors 12 and 13 include protrusion portions 12c and 13c, respectively, each of which protrudes arcuately. This configuration allows the distance between leg side portions 12d of coil conductor 12 and base side portion 13b of coil conductor 13 to be long, accordingly further decreasing the capacitance between coil conductors 12 and 13.

Moreover, protrusion portions 12c and 13c of base side portions 12b and 13b and protrusion portions 12e and 13e of leg side portions 12d and 13d of coil conductors 12 and 13 protrude arcuately. The protrusion portions provide coil conductors 12 and 13 with large cross-sectional areas, accordingly reducing an increase of direct-current resistance of the conductors.

The increase of the direct current resistance may can be reduces even with only one of protrusion portion 12c (13c) of base side portion 12b (13b) and protrusion portion 12e (13e) of leg side portion 12d (13d).

Apex portions 12a and 13a of coil conductors 12 and 13 have arcuate shapes. Arcuate portions of the apex portions relieve stresses to be received by coil conductors 12 and 13 when laminating the conductors. Therefore, even in cases where coil conductors 12 and 13 are thick, this configuration reduces degradation in adhesion between the insulating layers and coil conductors 12 and 13, thereby preventing coil conductors 12 and 13 from being delaminated from the insulating layers. Thus, even in cases where coil conductors 12 and 13 are close to each other, this configuration reduces the occurrence of the delamination and short circuits between them.

In conductors among coil conductors 12 and 13 adjacent to each other in a lateral direction perpendicular to lamination direction DX, points on leg side portions 12d (13d) are located away from each other in the lateral direction in which the lateral distance between the leg side portions increases as the points are located away from the widest portion of the conductor when viewed from above. Thus, the distance between the positions of the conductors adjacent to each other in the lateral direction becomes long. This configuration reduces possibility of accidental short circuit between the conductors adjacent to each other in the lateral direction, accordingly allows the distance between the conductors adjacent to each other in the lateral direction to be short, that is, allows the space between the conductors to be narrow. This allows an increase in the number of turns of each of coil conductors 12 and 13, accordingly increasing common mode impedance of common mode noise filter 1000.

Figure 8:
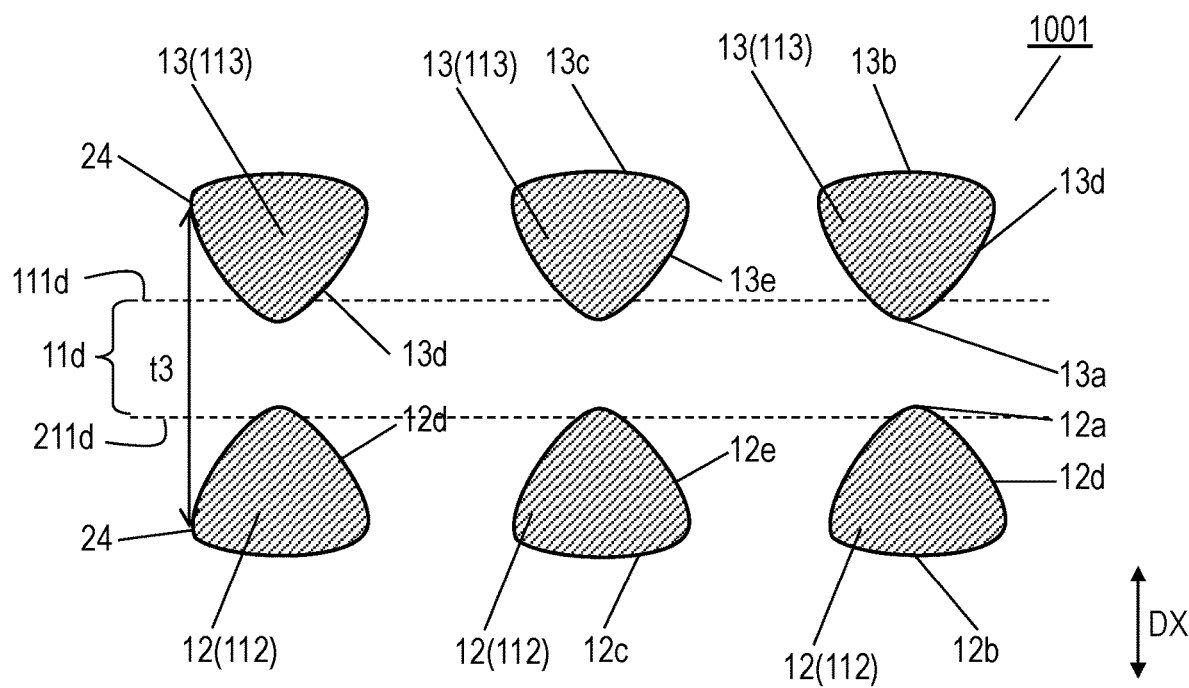
FIG. 8 is an enlarged cross-sectional view of another common mode noise filter according to the embodiment.

FIG. 8 is an enlarged cross-sectional view of another common mode noise filter 1001 according to the embodiment. In FIG. 8, components identical to those of common mode noise filter 1000 shown in FIG. 4 are denoted by the same numerals. In common mode noise filter 1001 shown in FIG. 8, apex portions 12a of coil conductor 12 face apex portions 13a of coil conductor 13 across insulating layer 11d in lamination direction DX.

In common mode noise filter 1001, apex portions 13a and base side portions 13b of coil conductor 13 are reversed in lamination direction DX with respect to common mode noise filter 1000 shown in FIG. 4.

This configuration increases the distance between leg side portion 12d of coil conductor 12 and leg side portion 13d of coil conductor 13 in lamination direction DX at a farther distance away from apex portions 12a and 13a, respectively. Thus, at such a farther distance, the distance between coil conductor 12 and coil conductor 13 is longer, accordingly further reducing the capacitance between coil conductor 12 and coil conductor 13.

In particular, in common mode noise filter 1001 shown in FIG. 8, distance t3 between leg side portion 12d of coil conductor 12 and base side portion 13b of coil conductor 13 is much longer at ends 24 of coil conductors 12 and 13 when viewed in lamination direction DX than common mode noise filter 1000 shown in FIG. 4.

In common mode noise filters 1000 and 1001 described above in accordance with the embodiment, coil conductors 12 and 13 face each other across insulating layer 11d in lamination direction DX and are magnetically coupled to each other. Each common mode noise filter according to the embodiment may include plural pairs of coil conductors, each of the pairs includes coil conductors that face each other across an insulating layer in lamination direction DX and that are magnetically coupled to each other. Moreover, such plural pairs may be disposed in an array type.

In the embodiments, terms, such as "upper surface", "lower surface", and "up-down direction", indicating directions indicate relative directions determined only by the relative positional relationship of constituent components, such as the insulating layers and the coil conductors, of the common mode noise filter, and do not indicate absolute directions, such as a vertical direction.

INDUSTRIAL APPLICABILITY

A common mode noise filter in accordance with the present invention prevents degradation of differential signals. The filter is useful particularly in applications common mode noise filters that are used, as countermeasures against noise, in a wide range of electronic equipment including digital equipment, audiovisual (AV) equipment, and information communication terminals.

REFERENCE MARKS IN THE DRAWINGS

11 laminated body
11a-11g insulating layer
12 coil conductor (first coil conductor)
12a apex portion
12b base side portion
13 coil conductor (second coil conductor)
13a apex portion
13b base side portion

The invention claimed is:
1. A common mode noise filter comprising:
   an insulating layer having a first surface and a second surface opposite to each other;
   a first coil conductor disposed on the first surface of the insulating layer and extending slenderly; and
   a second coil conductor disposed on the second surface of the insulating layer and extending slenderly, the second coil conductor facing the first coil conductor across the insulating layer,
   wherein a portion of the second coil conductor has a cross section crossing a direction in which the portion of the second coil conductor extends slenderly, the cross section including an apex portion and a base side portion opposite to the apex portion, the apex portion facing the first coil conductor across the insulating layer,
   wherein a width of the apex portion is smaller than a width of the base side portion, wherein the first coil conductor includes a portion having a cross section intersecting a direction in which the portion of the first coil conductor extends in a long slender shape, the cross section of the portion of the first coil conductor substantially having a triangular shape including an apex portion and a base side portion opposite to the apex portion, wherein the apex portion of the second coil conductor faces the apex portion of the first coil conductor across the insulating layer, and wherein a width of the apex portion of the first coil conductor is smaller than a width of the base side portion of the first coil conductor.

2. The common mode noise filter of claim 1, wherein the base side portion of the first coil conductor includes a base protrusion portion that protrudes arcuately.

3. The common mode noise filter of claim 1, wherein the cross section of the first coil conductor further includes a leg side portion connected to the apex portion of the first coil conductor and the base side portion of the first coil conductor, and wherein the leg side portion of the first coil conductor includes a protrusion portion that protrudes arcuately.

4. The common mode noise filter of claim 1, wherein the apex portion of the first coil conductor has an arcuate shape.

5. The common mode noise filter of claim 1, wherein the portion of the second coil conductor is any portion of the second coil conductor.

6. The common mode noise filter of claim 1, wherein the base side portion of the second coil conductor includes a base protrusion portion that protrudes arcuately.

7. The common mode noise filter of claim 1, wherein the cross section of the second coil conductor further includes a leg side portion connected to the apex portion of the second coil conductor and the base side portion of the second coil conductor, and wherein the leg side portion of the second coil conductor includes a protrusion portion that protrudes arcuately.

8. The common mode noise filter of claim 1, wherein the apex portion of the second coil conductor has an arcuate shape.

9. The common mode noise filter of claim 1, wherein the portion of the second coil conductor is any portion of the second coil conductor.

10. The common mode noise filter of claim 1, wherein the base side portion of the first coil conductor is opposite to the base side portion of the second coil conductor with respect to the apex portion of the first coil conductor and the apex portion of the second coil conductor.

11. The common mode noise filter of claim 10, wherein the first coil conductor is disposed along a first plane, wherein the second coil conductor is disposed along a second plane, wherein the base side portion of the first coil conductor is along the first plane, and wherein the base side portion of the second coil conductor is along the second plane.

12. The common mode noise filter of claim 10, wherein the first coil conductor is disposed along a first is substantially parallel to the second plane.

* * * * *